United States Patent
Oh

(10) Patent No.: US 6,735,142 B1
(45) Date of Patent: May 11, 2004

(54) POWER-UP CONTROL CIRCUIT WITH A POWER-SAVING MODE OF OPERATION

(75) Inventor: Seung Cheol Oh, San Jose, CA (US)

(73) Assignee: Nanoamp Solutions, Inc., San Jose, CA (US)

( * ) Notice: Subject to any disclaimer, the term of this patent is extended or adjusted under 35 U.S.C. 154(b) by 14 days.

(21) Appl. No.: 10/263,372

(22) Filed: Oct. 1, 2002

(51) Int. Cl.$^7$ ................................................. G11C 7/00
(52) U.S. Cl. ...................... 365/227; 365/226; 365/228; 365/229; 365/233; 327/143
(58) Field of Search ................................. 365/227, 226, 365/228, 229, 233; 327/143

(56) References Cited

U.S. PATENT DOCUMENTS

| | | | |
|---|---|---|---|
| 5,495,453 A | * | 2/1996 | Wojciechowski et al. ................................. 365/185.18 |
| 5,610,542 A | * | 3/1997 | Kang et al. .................. 327/143 |
| 5,767,710 A | | 6/1998 | Cho |
| 5,942,925 A | * | 8/1999 | Stahl .......................... 327/143 |
| 6,104,221 A | | 8/2000 | Hoon |

* cited by examiner

Primary Examiner—Connie C. Yoha
(74) Attorney, Agent, or Firm—Patrick T. King

(57) ABSTRACT

A power-up control circuit has three components including a normal power-supply voltage level detection section, a special command section for detecting a deep-sleep enable input signal, and an output driver section that logically combines the output signal of the normal power-supply voltage level detection section and the special command detecting section to provide an improved, combined power-up control signal CPWRUP. The combined power-up control signal CPWRUP signal is temporarily brought to a LOW state for a predetermined period of time immediately after the end of a power-saving mode of operation, such as a deep-sleep mode of operation for a memory device. The LOW state of the combined power-up control signal CPWRUP output signal allows all internal circuitry to be returned to their initial states that are the same as those obtained after a normal power-up sequence, even though the external voltage level stays at its normal level.

11 Claims, 3 Drawing Sheets

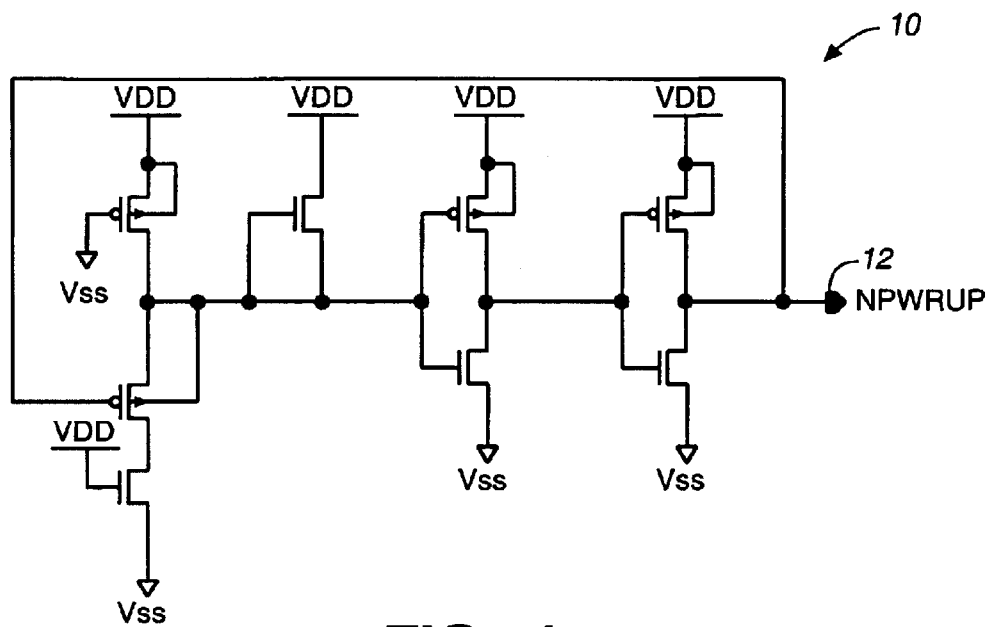
FIG._1
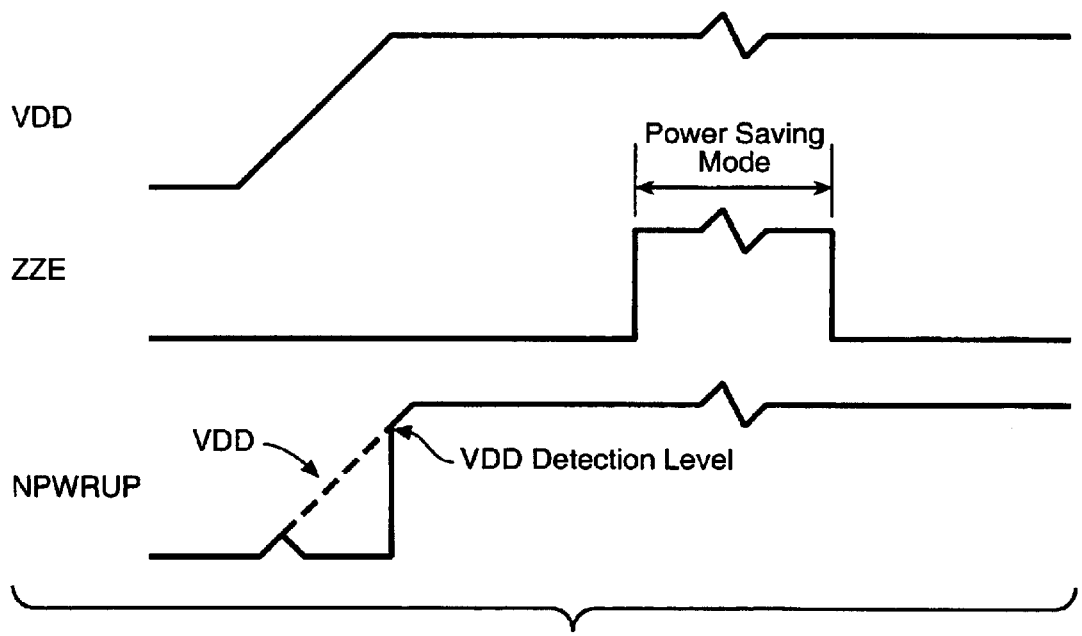
FIG._2

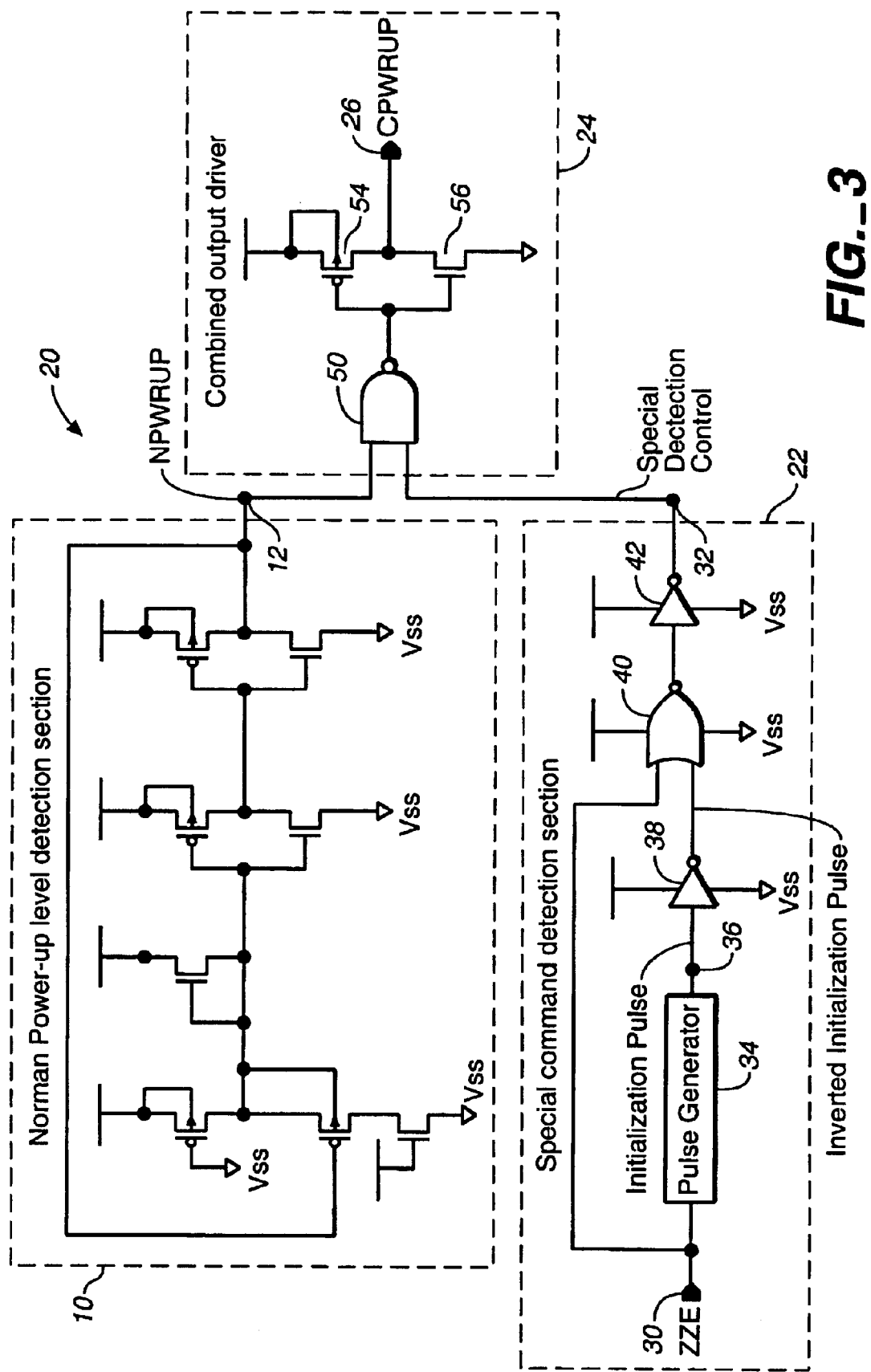
FIG._3

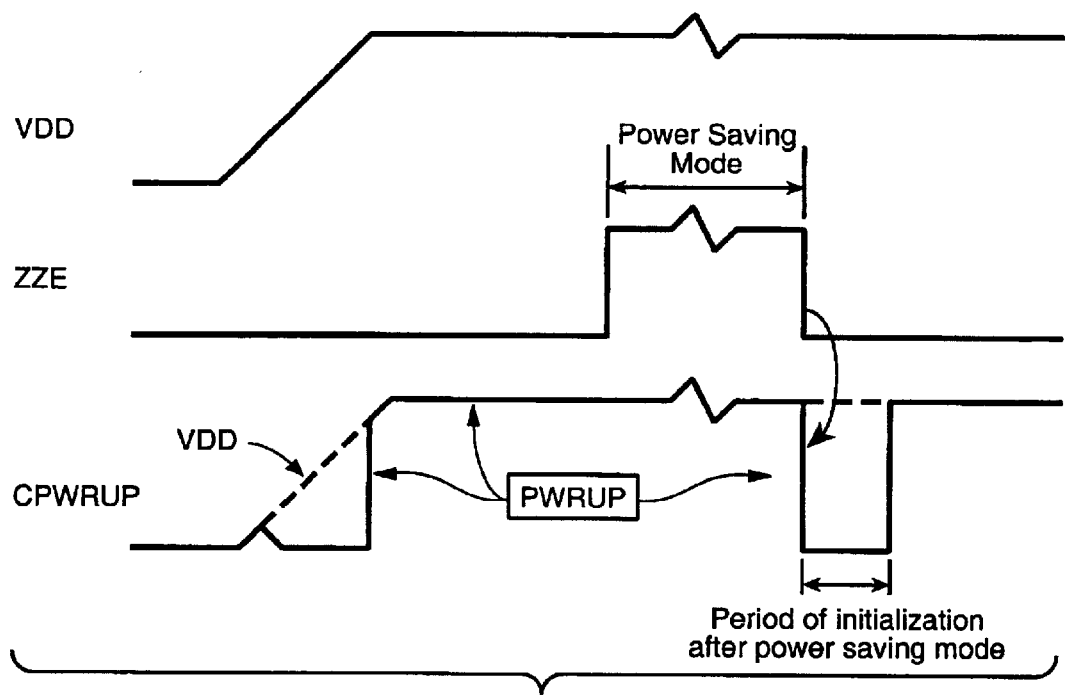
FIG._4
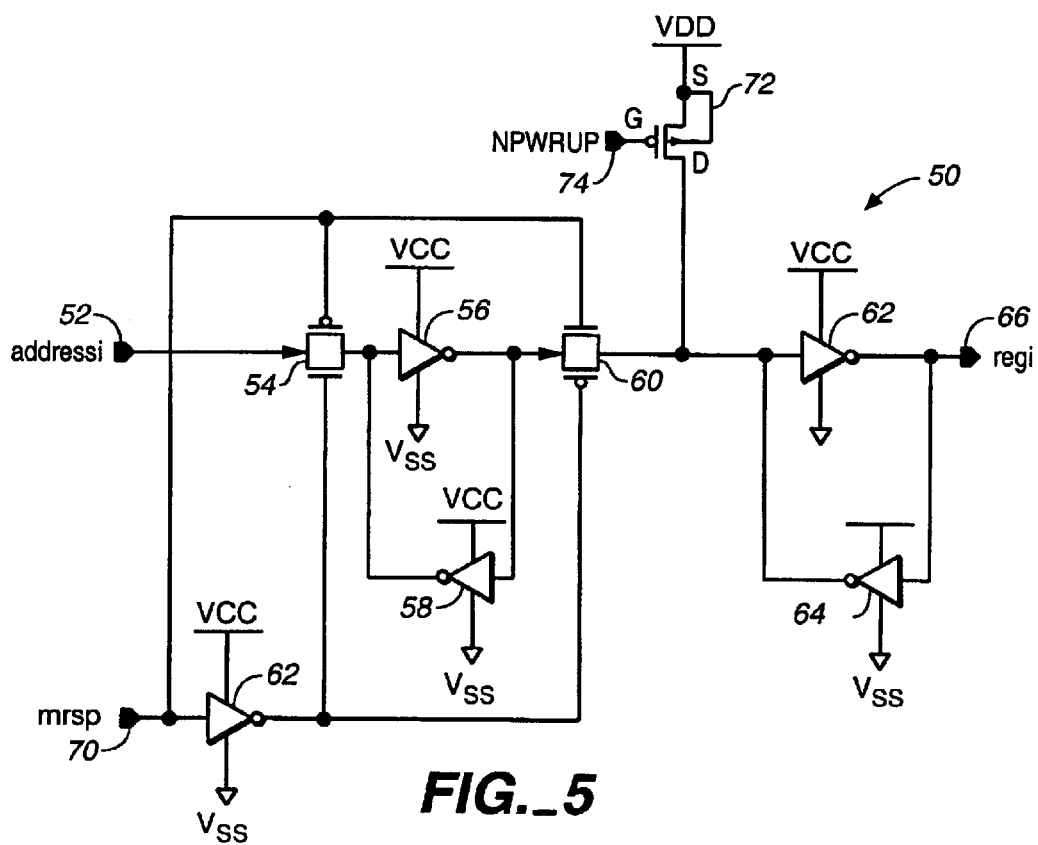
FIG._5

POWER-UP CONTROL CIRCUIT WITH A POWER-SAVING MODE OF OPERATION

BACKGROUND OF THE INVENTION

1. Field of the Invention.

This invention relates to a power-up control circuit for a semiconductor memory device and, more particularly, to a power-up control circuit that accommodates a power saving mode of operation, such as a deep-sleep mode of operation.

2. Prior Art.

When a semiconductor memory device is in a deep sleep mode of operation, all internal voltage regulators and any internal reference voltage generators are turned off to save power. In the deep-sleep mode, only a voltage from an external power supply is supplied to the memory device so that the semiconductor memory device is no longer operational in the deep-sleep mode of operation. After the deep-sleep mode of operation is completed, all data in the memory device is reset and the memory device goes through a normal power-up sequence. In a normal power-up sequence, all of the circuitry has to be initialized and all internal voltage regulators must be set up to operate in the normal mode of operation, followed by a power-up sequence and a memory data reset.

Previously known power-up control circuits cannot provide recovery from a deep-sleep mode of operation because they work by detecting a change in the level of the external voltage supply, which does not change in a power-saving mode such as a deep sleep mode of operation.

Consequently, a need exists for a power-up control circuit for a semiconductor memory device that accommodates a power-saving mode of operation, such as a deep-sleep mode of operation.

SUMMARY OF THE INVENTION

After a semiconductor memory device is initially turned on and after a power-up detection circuit determines that an external voltage has reached a predetermined level, a normal power-up NPWRUP signal goes to an active HIGH state to start a power-up sequence for the device. When the device is in a special mode of operation, such as a deep-sleep mode that is used to save power in, for example, low-power devices such as dynamic random access memory DRAM cells. In the deep-sleep mode of operation all memory cell data and all register data disappear because the internal reference sources and all internally regulated voltage are disabled. To accommodate a power-saving mode of operation such as a deep-sleep mode of operation, the present invention provides a power-up control circuit that has three component circuits including a normal power-supply voltage level detection section, a special command section for detecting a deep-sleep enable input signal, and an output driver section that logically combines the output signal of the normal power-supply voltage level detection section and the special command detecting section to provide a combined power-up control signal CPWRUP.

In the present invention, a power-up detection circuit and a power-up sequence for initialization of the memory device are the same as those for a normal power-up control circuit for an initial power-up operation. However, in the present invention, the combined power-up control signal CPWRUP is able to be temporarily brought to a LOW state for a predetermined period of time immediately after the end of a deep-sleep mode of operation. The LOW state of the combined power-up control signal CPWRUP allows all internal circuitry to be reset to their initial states that are the same as those obtained after a normal power-up sequence, even though the external voltage level stays at its normal level.

One preferred embodiment of the invention provides a memory-circuit power-up control circuit with a power-saving mode of operation with a normal power-up voltage level detection circuit; a special-command detection circuit; and a combined output driver circuit. The normal power-up voltage level detection circuit senses the level of an external supply voltage VDD and provides a normal power-up level detection output signal NPWRUP when the level of the VDD supply voltage exceeds a predetermined voltage level. The special-command detection circuit receives a power-saving enable input control signal ZZE and provides a special-command detection control output signal. The special-command detection circuit has an initialization pulse generator that provides an initialization control pulse signal that has a predetermined duration and that is triggered by the trailing edge of an active ZZE signal. The special-command detection control output signal is active either when the power-saving enable input control signal ZZE is active or when the initialization control pulse signal is inactive. The combined output driver circuit receives the normal power-up level detection output signal NPWRUP and the special command output signal and provides at an output terminal a combined power-up output signal CPWRUP that is normally active when the normal power-up level detection output signal NPWRUP is active and when either the ZZE signal is active or the ZZE delay signal is inactive.

The combined output driver circuit includes a logical AND function that combines the output signal NPWRUP of the normal power-up level detection circuit and special-command detection control output signal. The logical AND function is provided by a NAND gate and an inverter that drives the output terminal of the combined output driver circuit. The special command detection circuit includes a logical OR function that combines the ZZE input signal and an inverted initialization control pulse to provide the special-command detection control output signal.

The present invention provides a method of controlling a power-up function of a memory circuit to accommodate a power-saving mode of operation. The method includes the steps of: sensing the level of a an external voltage VEXT and providing an active normal power-up NPWRUP signal when the level of the external voltage exceeds a predetermined level; receiving a deep-sleep command signal ZZE in a special command detection section; providing an active special power-up output signall during the active time of the ZZE signal; triggering a pulse generator on the trailing edge of the ZZE signal to provide an initialization control pulse having a predetermined duration; providing an active special-command detection control output signal either when the power-saving enable Input control signal ZZE is active or when the initialization control pulse signal is inactive; and logically combining the normal PWRUP output signal with the special-command detection control output signal to provide a combined power-up output signal that is active during an active normal PWRUP signal except for the time of the inactive special PWRUP signal having the predetermined duration.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a circuit diagram of a power-up control circuit.

FIG. 2 is a timing diagram for the circuit of FIG. 1

FIG. 3 is a circuit diagram of an improved power-up control circuit with a power-saving mode of operation.

FIG. 4 is a timing diagram for the circuit of FIG. 3.

FIG. 5 is a circuit diagram of a register circuit that is controlled by the improved power-up circuit of FIG. 3.

DETAILED DESCRIPTION OF THE PREFERRED EMBODIMENTS

Reference is now made in detail to preferred embodiments of the invention, an example of which is illustrated in the accompanying drawings. While the invention is described in conjunction with a preferred embodiment, it will be understood that it is not intended to limit the invention to this embodiment. On the contrary, the invention is intended to cover alternatives, modifications and equivalents, which may be included within the spirit and scope of the invention as defined by the appended claims.

FIG. 1 shows a power-up voltage level detection circuit 10 for a semiconductor memory device that has an output terminal 12 at which is provided a normal power-up level detection output signal NPWRUP. After a semiconductor memory device is initially turned on, an external voltage that is provided to the memory device VDD ramps up toward a final voltage level. The level detector circuit 12 senses the level of the external VDD voltage. When the VDD voltage reaches a predetermined level, the level detection circuit 10 provides an active HIGH state for the normal power-up level detection output signal NPWRUP at the output terminal 12.

FIG. 2 is a timing diagram for the normal power-up voltage level detection circuit 10 of FIG. 1. The externally supplied VD voltage level is shown ramping up from 0 volts to it operating level. The NPWRUP signal is shown to be initially at an inactive. LOW state. The NPWRUP signal initially remains low until the VDD voltage reaches the VDD detection level, at which time the NPWRUP signal switches to an active HIGH state.

For reference purposes, FIG. 2 shows a power-saving enable input control signal ZZE that goes to an active HIGH state to initiate a power saving mode of operation. However, the normal power-up voltage level detection circuit 10 of FIG. 1 cannot handle the occurrence of a special command such as a power-saving enable input control signal ZZE. The ZZE signal is used to initiate a power saving mode of operation, such as a deep-sleep mode of operation. Previously known power-up control circuits, such as disclosed in FIG. 1, cannot provide signals for recovery from a deep-sleep mode of operation because the circuit of FIG. 1 works by detecting a change in the externally supplied VDD voltage level, which does not change in a deep sleep mode of operation. In a deep-sleep mode of operation the externally supplied VDD voltage remains at a high level, while all internal voltage regulators and all internal reference voltage generators are turned off to save power.

FIG. 3. illustrates an embodiment of an improved power-up control circuit 20 which accommodates a special mode of operation, such as a power-saving mode of operation for a memory device. When a device such as a memory integrated circuit is in a special mode of operation, such as a deep-sleep mode, this special mode of operation is invoked to save power in, for example, low-power devices that have dynamic random access memory DRAM cells. In the deep-sleep mode of operation all memory cell data and all register data disappear because internal reference voltages and internal voltage regulators are turned off to save power.

To accommodate a power-saving mode of operation, the improved power-up control circuit 20 according to the present invention as illustrated in FIG. 3 has three components including the normal power-supply voltage level detection circuit 10, a special command circuit 22 for detecting a power-saving enable input signal, and a combined output driver circuit 24 that logically combines the output signal of the normal power-supply voltage level detection circuit 10 and the special command detection circuit 22 to provide a combined power-up control signal CPWRUP from the combined output driver section 24 at an output terminal 26.

The special-command detection circuit 22 receives a power-saving enable input control signal ZZE at an input terminal 30. The ZZE signal is in an active HIGH state as long as the memory device is in power-saving mode such as the deep-sleep mode of operation so that the memory device remains in a power-saving mode of operation. Therefore, the duration of the active HIGH state of the ZZE signal varies depending on the duration of the power saving or deep-sleep mode.

A special detection control signal is provided at an output terminal 32 of the special-command detection circuit 22. The input terminal 30 of the special-command detection circuit 22 is connected to an input terminal of a pulse generator 34. The pulse generator is triggered after a deep sleep mode of operation is terminated by a trailing, negative-going edge of the ZZE signal as the ZZE signal goes to an inactive LOW state. The pulse generator 34 provides an active-HIGH initialization pulse with a predetermined duration at a output terminal 36. As described herein below, the initialization pulse is used to temporarily bring an active HIGH CPWRUP signal at the output terminal 26 of the combined output driver circuit 24 to a temporarily inactive-LOW state which temporarily causes the normally HIGH VDD signal to the memory device to go to zero volts. This cause the memory device to reinitialize its registers and memory cells upon resumption of the HIGH VDD level.

The active-HIGH initialization pulse at terminal 36 is inverted in an inverter 38, the output terminal of which is connected to one input terminal of a logical OR function that is provided by the combination of an OR gate 40 and an inverter 42. The output terminal of the inverter 42 is connected to the output terminal 32 of the special-command detection circuit 22. The ZZE input signal is provided to the other input terminal of the AND gate 40, 42.

The special-command detection control output signal at terminal 32 is active HIGH either when the power-saving enable input control signal ZZE is active HIGH or when the initialization control pulse signal at the output terminal 36 of the pulse generator is inactive. Note that the initialization control pulse signal at the output terminal 36 of the pulse generator 34 is only active for a predetermined time immediately after the end of the power saving mode of operation.

FIG. 3 shows that the combined output driver circuit 24 has an NAND gate 50 that is combined with a CMOS inverter formed with PMOS transistor 52 and an NMOS transistor 54 to provide a logical AND function having an output signal at the output terminal 26. One input terminal of the NAND gate 50 receives the normal power-up level detection output signal NPWRUP. The other input terminal of the NAND gate 50 receives the special command output control signal from the output terminal 32 of the special command circuit 22. The output terminal of the special command detection circuit 22 provides the combined power-up output signal CPWRUP that is normally active when both the normal power-up level detection output signal NPWRUP is active and when either the ZZE signal is active or the initialization control pulse signal is inactive.

FIG. 4 is a timing diagram for the power-up control circuit 20 that accommodates a special mode of operation, such as a power-saving mode of operation. The VDD voltage level is shown in a power-up sequence ramping up from 0 volts to it operating level. Superimposed in dashed form on the output CPWRUP signal is the VDD voltage signal. The output CPWRUP signal is shown to be initially at an inactive LOW state. The NPWRUP signal initially remains low until the VDD voltage reaches the VDD detection level, at which time the NPWRUP signal switches to an active HIGH state.

The power-saving enable input control signal ZZE occurs sometime after the initial power-up sequence is completed and is active HIGH for as long as a power-saving, deep-sleep mode of operation is needed. The active HIGH state of the ZZE signal keeps the memory device in the power-saving mode of operation in which all internal voltage regulators and all internal reference voltage generators are turned off to save power. Note that the VDD signal remains HIGH.

The trailing, negative-going edge of the ZZE signal produces a temporarily inactive-LOW state for the CPWRUP signal at terminal 26 of the combined output driver circuit 24 which temporarily causes the normally HIGH VDD signal to the memory device to go to zero volts to provide a predetermined period of initialization after the power saving mode of operation terminates. This low VDD voltage causes the memory device to reinitialize its registers and memory cells upon resumption of the HIGH VDD level.

The present invention provides a method of controlling a power-up function of a memory circuit to accommodate a power-saving mode of operation. The method includes sensing the level of the external voltage VDD and providing an active HIGH normal power-up NPWRUP signal when the level of the external voltage VDD exceeds a predetermined level. After the special command detection section receives a power-saving command signal ZZE, the active special power-up output signal SPWRUP is provided at terminal 26 during the active time of the ZZE signal. After the power-saving mode of operation is terminated, the pulse generator 34 is triggered on the trailing edge of the ZZE signal to provide an initialization control pulse having a predetermined duration. The special-command detection control output signal is active either when the power-saving enable input control signal ZZE is active or when the initialization control pulse signal is inactive. The normal PWRUP output signal is logically combined in an AND function with the special-command detection control output signal to provide a combined power-up output signal that is active during an active normal PWRUP signal except for the time that the inactive special PWRUP signal provides for the predetermined period of initialization immediately after a power saving mode of operation ends.

FIG. 5 illustrates an example of an address register circuit 50 for a memory device that is controlled by the improved power-up control circuit of FIG. 3. It will be seen that the external VDD voltage for the register circuit 50 is interrupted immediately after the end of a power-saving mode of operation. An input address signal addressi is provided at an input terminal 52 that is connected to an input terminal of a first CMOS transmission gate 54. An output terminal of the other CMOS transmission gate 54 is connected to an input terminal of an input latch circuit formed by a pair of inverters 56, 58 are connected so that an output terminal of one is connected to an input terminal of the other and vice-versa. The output terminal of the latch 56, 58 is connected to an input terminal of another CMOS transmission gate 60. An output terminal of the CMOS transmission gate 60 is connected to an input terminal of an output latch circuit that is formed by a pair of inverters 62, 64 that are connected so that an output terminal of one is connected to an input terminal of the other and vice-versa. An output terminal of the output latch is connected to a register output terminal 66 for a register output signal regi.

A register load control signal MRSP is provided at an input terminal 70 to a PMOS gate terminal of the first CMOS transmission gate 54 and to an NMOS gate terminal of the other transmission gate 60. The MSRP signal is inverted in an inverter 62 and applied to an NMOS gate terminal of the first CMOS transmission gate 54 and to a PMOS gate terminal of the other transmission gate 60. The input addressi signal is initially loaded into the input latch 56, 58 through the transmission gate 54 and then into the output latch 62, 64 through the transmission gate 60. Typically, all of the inverters have their VCC voltages cutoff during a deep-sleep mode of operation.

A reset PMOS transistor 72 has a source terminal connected to the external VDD voltage source and a drain terminal connected to the input terminal of the latch 62, 64. The VDD voltage source is not disabled during a power-down mode of operation, such as a deep-sleep mode. A gate terminal 74 of the PMOS reset transistor 72 is provided with the combined power-up control signal NPWRUP. After a deep-sleep mode of operation ends, the combined power-up control signal NPWRUP goes to a LOW state for a predetermined period of time, so that the input terminal of the latch 62, 64 is held to a HIGH state while the VCC voltages are being restored to the inverters of the register circuit 50. The HIGH state on the input of the latch 62, 64 forces the register output signal regi at the register output terminal 66 to an initial LOW state. After the combined power-up control signal NPWRUP goes to a HIGH level, the PMOS reset transistor 72 is cutoff and does not affect the operation of the register 50.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. A power-up control circuit with a power-saving mode of operation, comprising:

a power-up voltage level detection circuit that senses the level of an external supply voltage VDD and that provides a normal power-up level detection output signal NPWRUP when the level of the VDD supply voltage exceeds a predetermined voltage level;

a special-command detection circuit that receives a power-saving enable input control signal ZZE and that provides a special-command detection control output signal, said special-command detection circuit has an initialization pulse generator that provides an initialization control pulse signal that a predetermined duration and that is triggered by the trailing edge of an active ZZE signal wherein the special-command detection control output signal is active either when the power-saving enable input control signal ZZE is active or when the initialization control pulse signal is inactive;

a combined output driver circuit that receives the normal power-up level detection output signal NPWRUP and the special command output signal and that provides at an output terminal a combined power-up output signal CPWRUP that is normally active when the normal power-up level detection output signal NPWRUP is active and when either the ZZE signal is active or the initialization control pulse signal is inactive.

2. The control circuit of claim 1 wherein the combined output driver circuit includes a logical AND function that combines the output signal NPWRUP of the normal power-up level detection circuit and the special-command detection control output signal.

3. The control circuit of claim 2 wherein the logical AND function is provided by a NAND gate and an inverter that drives the output terminal of the combined output driver circuit.

4. The control circuit of claim 1 wherein the special command detection circuit includes a logical OR function that combines the ZZE input signal and an inverted initialization control pulse signal to provide the special-command detection control output signal.

5. The control circuit of claim 1 wherein the power-up control circuit is for a memory circuit.

6. The control circuit of claim 1 wherein the power-saving mode of operation includes a deep-sleep mode of operation in which any internal reference voltage sources and any internal voltage regulators are inactive in the deep-sleep mode of operation and external voltages are not interrupted in the deep-sleep mode of operation.

7. A memory-circuit power-up control circuit with a power-saving mode of operation, comprising:

a normal power-up voltage level detection circuit that senses the level of an external supply voltage VDD and that provides a normal power-up level detection output signal NPWRUP when the level of the VDD supply voltage exceeds a predetermined voltage level;

a special-command detection circuit that receives a power-saving enable input control signal ZZE and that provides a special-command detection control output signal, said special-command detection circuit has an initialization pulse generator that provides an initialization control pulse signal that is triggered by the trailing edge of an active ZZE signal and that has a predetermined duration; wherein the special command detection circuit includes a logical OR function that combines the ZZE input signal and an inverted initialization control pulse to provide the special-command detection control output signal; and wherein the special-command detection control output signal is active either when the power-saving enable input control signal ZZE is active or when the initialization control pulse signal is inactive; and a combined output driver circuit that receives and combines the normal power-up level detection output signal NPWRUP and the special command output signal with a logical AND function that combines the output signal NPWRUP of the normal power-up level detection circuit and special-command detection control output signal; and wherein the combined output driver circuit provides at an output terminal a combined power-up output signal CPWRUP that is normally active when the normal power-up level detection output signal NPWRUP is active and when either the ZZE signal is active or the ZZE delay signal is inactive.

8. The control circuit of claim 7 wherein the logical AND function is provided by a NAND gate and an inverter that drives the output terminal of the combined output driver circuit.

9. The control circuit of claim 7 wherein the power-saving mode of operation includes a deep-sleep mode of operation in which any internal reference voltage sources and any internal voltage regulators are inactive in the deep-sleep mode of operation and external voltages are not interrupted in the deep-sleep mode of operation.

10. A method of controlling a power-up function of a memory circuit, comprising the steps of:

sensing the level of a an external voltage VEXT and providing an active normal power-up NPWRUP signal when the level of the external voltage exceeds a predetermined level;

receiving a power-saving enable input control signal ZZE in a special command detection section;

providing an active special power-up output signal during the active time of the ZZE signal;

triggering a pulse generator on the trailing edge of the ZZE signal to provide an initialization control pulse having a predetermined duration;

providing an active special-command detection control output signal either when the power-saving enable input control signal ZZE is active or when the initialization control pulse signal is inactive; and logically combining the normal PWRUP output signal with the special-command detection control output signal to provide a combined power-up output signal that is active during an active normal PWRUP signal except for the time of the inactive special PWRUP signal having the predetermined duration.

11. The method of claim 10 wherein the power-saving mode of operation includes a deep-sleep mode of operation in which any internal reference voltage sources and any internal voltage regulators are inactive in the deep-sleep mode of operation and external voltages are not interrupted in the deep-sleep mode of operation.

* * * * *